(12) United States Patent
Burggraf et al.

(10) Patent No.: US 9,390,956 B2
(45) Date of Patent: Jul. 12, 2016

(54) METHOD FOR THE TEMPORARY CONNECTION OF A PRODUCT SUBSTRATE TO A CARRIER SUBSTRATE

(71) Applicant: EV GROUP E. THALLNER GMBH, St. Florian Am Inn (AT)

(72) Inventors: Jurgen Burggraf, Scharding (AT); Gerald Mittendorfer, Suben (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 23 days.

(21) Appl. No.: 14/376,460

(22) PCT Filed: Jan. 17, 2013

(86) PCT No.: PCT/EP2013/050849
§ 371 (c)(1),
(2) Date: Aug. 4, 2014

(87) PCT Pub. No.: WO2013/120648
PCT Pub. Date: Aug. 22, 2013

(65) Prior Publication Data
US 2014/0374144 A1 Dec. 25, 2014

(30) Foreign Application Priority Data

Feb. 16, 2012 (DE) .......................... 10 2012 101 237

(51) Int. Cl.
*H05K 1/02* (2006.01)
*H01L 21/683* (2006.01)

(52) U.S. Cl.
CPC .......... *H01L 21/6835* (2013.01); *H05K 1/0213* (2013.01); *H01L 2221/6834* (2013.01); *H01L 2221/68309* (2013.01); *H01L 2221/68318* (2013.01); *H01L 2221/68381* (2013.01)

(58) Field of Classification Search
CPC .................................................... H05K 1/144
USPC ........................................................ 174/259
See application file for complete search history.

(56) References Cited

U.S. PATENT DOCUMENTS 5,590,461 A * 1/1997 Ishida ................ H01L 21/4857
174/255
5,863,375 A 1/1999 Cha et al. ....................... 156/344
(Continued)

FOREIGN PATENT DOCUMENTS

CN 1868040 A 11/2006 ............. C09J 201/00
DE 102006000687 A1 7/2007 ............ H01L 21/673
(Continued)

OTHER PUBLICATIONS

Preliminary Examination Opinion filed in corresponding International Application No. PCT/EP2013/050849, dated Mar. 7, 2014 (English-language translation included).
(Continued)

*Primary Examiner* — Chau N Nguyen
(74) *Attorney, Agent, or Firm* — Kusner & Jaffe

(57) ABSTRACT

A method for temporary connection of a product substrate to a carrier substrate comprised of the steps of:
applying an interconnect layer to a product substrate receiving side of the carrier substrate in an interconnect surface section of the product substrate receiving side,
applying an antiadhesion layer with low adhesion force to one interconnect side of the product substrate in an antiadhesion surface section of the interconnect side, the antiadhesion surface section corresponding to the interconnect surface section, in terms of area, wherein a receiving space is formed which is bordered by the interconnect layer and the carrier substrate as well as the product substrate and the antiadhesion layer accommodating structures which are provided on the interconnect side of the product substrate and which project from the interconnect side,
aligning the product substrate relative to the carrier substrate and bonding of the interconnect layer to the antiadhesion layer on one contact surface.

8 Claims, 2 Drawing Sheets

(56) References Cited

U.S. PATENT DOCUMENTS

| | | | |
|---|---|---|---|
| 6,462,415 B1 | 10/2002 | Ishiguri et al. | 257/738 |
| 7,438,631 B2 | 10/2008 | Nagamoto et al. | 451/59 |
| 7,482,249 B2 | 1/2009 | Jakob et al. | 438/460 |
| 7,883,991 B1 | 2/2011 | Wu et al. | 438/459 |
| 7,975,378 B1 * | 7/2011 | Dutta | H05K 1/0253 174/255 |
| 2007/0066184 A1 | 3/2007 | Nagamoto et al. | 451/41 |
| 2009/0017248 A1 | 1/2009 | Larson et al. | 428/41.5 |
| 2011/0308739 A1 | 12/2011 | McCutcheon et al. | 156/766 |

FOREIGN PATENT DOCUMENTS

| | | | |
|---|---|---|---|
| EP | 1681713 A1 | 7/2006 | H01L 21/304 |
| EP | 2398040 A1 | 12/2011 | H01L 21/00 |
| JP | 2004/288725 A | 10/2004 | H01L 21/304 |
| WO | WO 2007/099146 A1 | 9/2007 | H01L 21/304 |

OTHER PUBLICATIONS

International Search Report for corresponding International Application No. PCT/EP2013/050849 dated Apr. 18, 2013 (3 pages).

Search Report and Opinion issued in corresponding Singapore Patent Application No. 11201404960T.

Search Report from corresponding Chinese Patent Application No. 201380009852.0 dated Mar. 9, 2016.

First Office Action issued in corresponding Chinese Patent Application No. 201380009852.0 dated Mar. 23, 2016.

* cited by examiner

METHOD FOR THE TEMPORARY CONNECTION OF A PRODUCT SUBSTRATE TO A CARRIER SUBSTRATE

FIELD OF THE INVENTION

The invention relates to a method for temporary connection of a product substrate to a carrier substrate.

BACKGROUND OF THE INVENTION

The processing of product substrates having structures such as chips thereon is often necessary in the semiconductor industry and can comprise mechanical and/or chemical or other processing steps (lithography, resist application, coating, etc.) as well as transport of the product substrates from A to B.

In addition, there is enormous miniaturization pressure at larger and larger radii of the product substrates (200 mm, 300 mm, up to 450 mm) in order to further increase the component density. It can be easily imagined that the handling of these paper-thin product substrates poses major technical problems.

Depending on the carrier materials used and the interconnect layer used between the carrier and the product substrate various methods are known for dissolving or destroying the interconnect layer, such as for example the use of UV light, laser beams, the action of temperature, or solvents.

Stripping increasingly constitutes one of the most critical process steps since the thin substrates, with substrate thicknesses of a few microns, break easily during stripping/removal or are damaged by the forces which are necessary for the stripping process.

Moreover, the thin substrates have little or no stability of shape and typically roll up without support material. During handling of the product substrates which are generally based on back-thinned wafers, fixing and support of the wafers are essentially indispensable.

Known methods for temporary connection of a product substrate to a carrier substrate for easy stripping of the wafer are based for example on double-sided adhesive films, liquids, wax or similar substances so that the product substrate after processing can be separated from the carrier substrate as easily as possible with as little energy as possible. These methods are shown in U.S. Pat. No. 5,725,923, US 2007/0184630, EP 1286385A2 and U.S. Pat. No. 5,863,375.

The following technical problems prevail in temporary connection:

1. High material consumption of partially expensive materials.
2. High temperatures in temporary connection and for this reason high energy consumption.
3. Time-consuming stripping processes, especially in chemical separation/dissolution of the interconnect layer, especially for wet chemical processes which are generally complex, polluting and thus inefficient. In chemical dissolution, incomplete dissolution of the interconnect layer prior to stripping of the product substrate can result in some sites continuing to act adhesively, which can lead to destruction of the product wafer during stripping at these sites.
4. Cleaning of the product substrate after stripping is necessary.

It is therefore the object of this invention to devise a method for temporarily connecting a product substrate on a carrier substrate as nondestructively as possible and with the minimum possible energy expenditure, wherein the product substrate can again be easily detached from the carrier substrate.

This object is achieved with the features of the claims. Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

SUMMARY OF THE INVENTION

The invention is based on the idea of applying an antiadhesion layer to the product substrate instead of to the carrier substrate, especially in regions which are occupied by chips. The antiadhesion layer is preferably applied on the peripheral edge of the product substrate, even more preferably in a region on whose opposite side on the carrier substrate there is an interconnect layer.

In this way it is possible to form on the carrier substrate a receiving space for the structures provided on the product substrate, especially chips, by the interconnect layer and the carrier substrate.

The antiadhesion layer is dimensioned and made such that upon making contact with the interconnect layer on the carrier substrate an adhesion force which is sufficient for processing and transport of the product substrate takes effect.

The product substrate is defined as a product substrate, for example a semiconductor wafer, which is conventionally thinned to a thickness between 0.5 μm and 250 μm, the trend being toward thinner and thinner product substrates.

The carrier is, by the way of example and not limitation, a carrier substrate with a thickness between 50 μm and 5000 μm, in particular between 500 μm and 1000 μm.

According to one preferred embodiment of the invention, the interconnect surface section is located on the peripheral edge of the carrier substrate especially in a ring section which is concentric preferably to the product substrate receiving side. By homogeneous application and/or application of the interconnect layer and/or antiadhesion layer distributed uniformly over the respective surfaces, on the lateral periphery of the product substrate and/or of the carrier substrate, in particular in a preferably concentric ring section, the product substrate is attached to the carrier substrate with as little effort as possible and can be as easily detached again from it without damaging the structures which are present on the product substrate.

Advantageously, the structures are surrounded at least partially, preferably completely, by the antiadhesion layer. In this way the structures are simultaneously protected by the antiadhesion layer from external effects.

According to another advantageous embodiment of the invention, the product substrate is stripped from the carrier substrate by applying to the carrier substrate a tensile force which acts at least largely centrically or at least largely laterally on one stripping side of the carrier substrate, which side faces away from the product substrate receiving side.

It is especially advantageous if the tensile force is applied by means of a preferably flexible carrier holder which draws in the stripping side, especially in a blanket manner. A chuck, in particular a spinner chuck, is especially well suited as a carrier holder for accommodating the carrier substrate, especially by means of negative pressure, for example suction tracks, holes or suction cups. Alternatively, mechanical holding, for example by lateral clamps, is conceivable. In another alternative configuration, the holding takes place electrostatically. In particular, in the temporary stripping a flexible carrier holder is advantageous so that the product substrate can be carefully stripped, while a rigid carrier holder is conceivable for lateral stripping.

A product substrate holder is made especially in the same way, preferably identically to the carrier holder, and applies a force opposite the carrier holder to the product substrate, especially in a blanket manner.

To the extent the stripping takes place concentrically from one inner side of the contact surface pointing toward the receiving space, this applies to the version of centric action on the carrier substrate during stripping, especially in conjunction with the flexible carrier holder. This results in careful stripping which is directed piece by piece uniformly from the center to the periphery.

Conversely, it is advantageously conceivable as claimed in the invention, in the version of the largely lateral stripping of the product substrate from carrier substrate or vice versa of the carrier substrate from the product substrate, to provide partial detachment by mechanical separating means, as a result of which the start of stripping takes place less jerkily and thus more carefully for the product substrate.

As claimed in the invention, it is advantageously provided that the adhesion force which is acting between the interconnect layer and the antiadhesion layer is between $0.1$ $mJ/m^2$ and 10 $J/m^2$, especially between 1 $mJ/m^2$ and 1 $J/m^2$, the adjustment taking place by material selection and by the size of the contact area.

Other advantages, features and details of the invention will become apparent from the following description of preferred exemplary embodiments and using the drawings.

DETAILED DESCRIPTION OF PREFERRED EMBODIMENTS

In the figures, the same components and components with the same function are identified with the same reference numbers.

Figure 1:
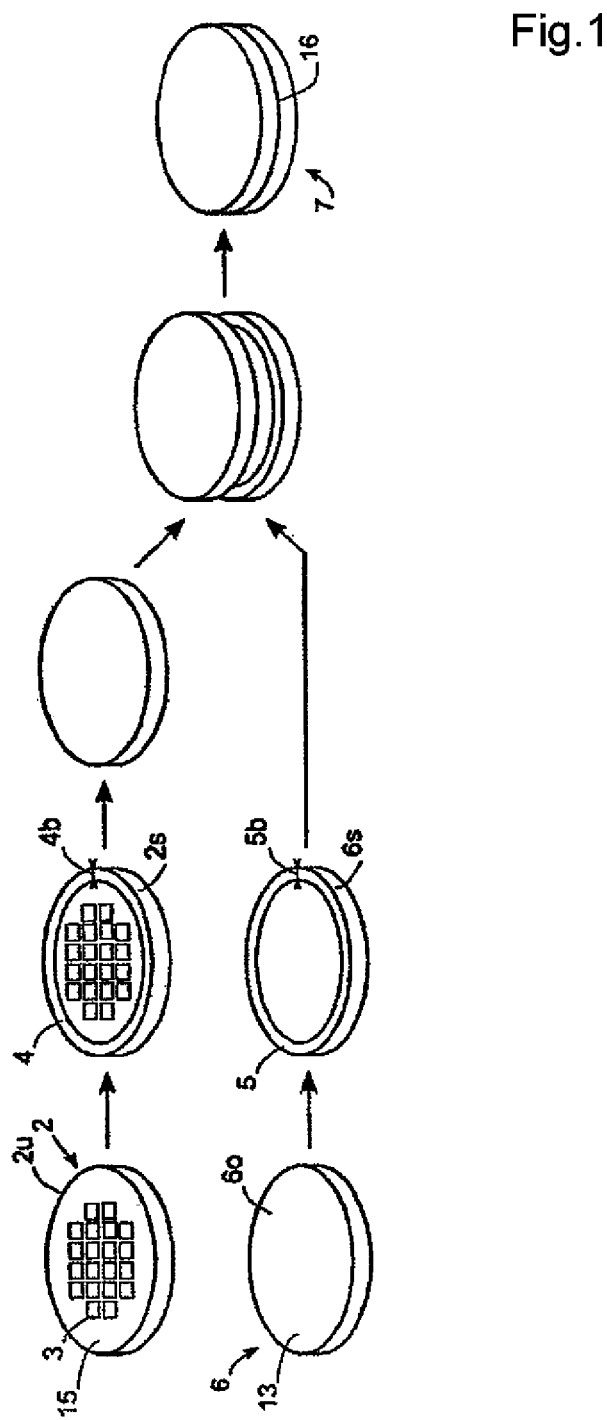
FIG. 1 schematically illustrates of a method for the temporary connection of a product substrate to a carrier substrate according to the invention.

FIG. 1 describes a method sequence according to the present invention for temporary connection of a product substrate 2, which is provided with structures 3, in particular a topography, preferably at least partially consisting of chips, to a carrier substrate 6. The sequence is from left to right, up to the finished product substrate-carrier substrate composite 7 in the plane of the drawing.

Referring now to the carrier substrate 6, a ring-shaped interconnect layer 5 is applied to an interconnect surface section 13 of a product substrate receiving side 6o of the carrier substrate 6. The interconnect layer is concentric to the product substrate receiving side 6o and extends to the inside from the lateral periphery 6s of the carrier substrate 6. The interconnect layer 5 projects from the product substrate receiving side 6o.

In particular parallel hereto, preferably at the same time, an antiadhesion layer 4 is applied to one interconnect side 2u of the product substrate 2 in an antiadhesion surface section 15. The antiadhesion layer 4 extends from one lateral periphery 2s of the product substrate 2 to the inside and forms a concentric ring section. The ring width 4b of the antiadhesion layer 4 corresponds roughly to the ring width 5b of the interconnect layer 5. The antiadhesion layer 4 likewise projects from the interconnect side 2u. The antiadhesion layer 4 surrounds, i.e., encompasses, the structures 3 which have been applied to the interconnect side 2u.

The ring width 4b and/or ring width 5b is advantageously between 1 mm and 25 mm, especially between 5 mm and 15 mm.

Then, the product substrate 2 is turned by 180 degrees, i.e., rotated, more or less upside down, in order to mechanically and/or optically align the product substrate 2 with the antiadhesion layer 4 in another step relative to the carrier substrate 6 with its interconnect layer 5.

Then, in another method step the antiadhesion layer 4 is temporarily bonded to the interconnect layer 5 on one contact surface 16.

Figure 2:
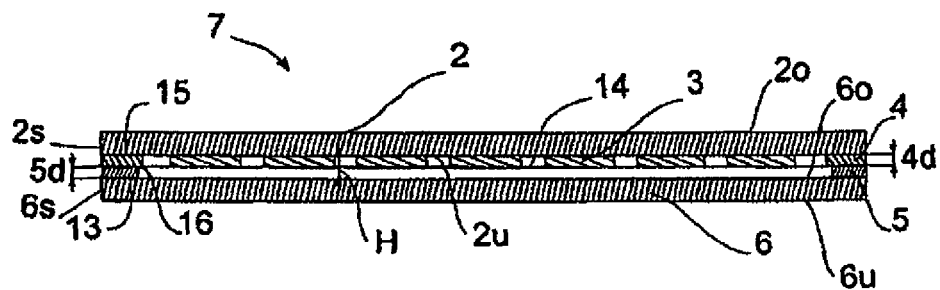
FIG. 2 shows a schematic side view of a product substrate which is joined to a carrier substrate.

As shown in FIG. 2, the method of the invention comprises applying the antiadhesion layer 4 only on the edge, i.e., peripherally, and not over the entire surface of the product substrate 2 and/or of the carrier substrate 6. The structures 3, especially dices of the product substrate 2, especially of a product wafer, are located within the annular antiadhesion layer 4. The interconnect layer 5 with correspondingly strong adhesive action is applied to the carrier substrate 6 likewise peripherally and corresponding to the antiadhesion layer 4. After making contact, a receiving space 14 for accommodation of the structures 3 is formed. A seal is also formed by the product substrate 2 and the respective circular ring-shaped interconnect layer 5 which has been applied to the respective lateral periphery 2s and 6s. The antiadhesive layer 4 and the carrier substrate 6, and the thickness 4d of the antiadhesion layer 4 and the thickness 5d of the interconnect layer 5, jointly form the height H of the receiving space 14 which is higher than the structures 3 on the product wafer 2, so that the structures 3 do not touch the carrier wafer 6. The thickness 4d is advantageously greater than the thickness of a monolayer and less than 5 μm, especially less than 2 μm. In one embodiment, the thickness 5d is between 1 μm and 1000 μm, especially between 5 μm and 500 μm, preferably between 10 μm and 200 μm. By adjusting the thickness 5d the height H of the receiving space 14 can be adapted to the height of the structures 3.

The contact surface 16 which forms the temporary bond between the carrier substrate 6 and the product substrate 2 has a much smaller area than in the existing, conventionally known methods. During stripping, only the adhesion forces, which are acting between the antiadhesion layer 4 and the interconnect layer 5 need be overcome. The adhesion forces are large enough to hold the product substrate 2 and the carrier substrate 6 together during the processing and during the transport, but they can be separated from one another again with relatively little expenditure of force, since the contact surface 16 takes up only a small part of the total area of the product substrate receiving side 6o and/or of the interconnect side 2u.

Figure 3:
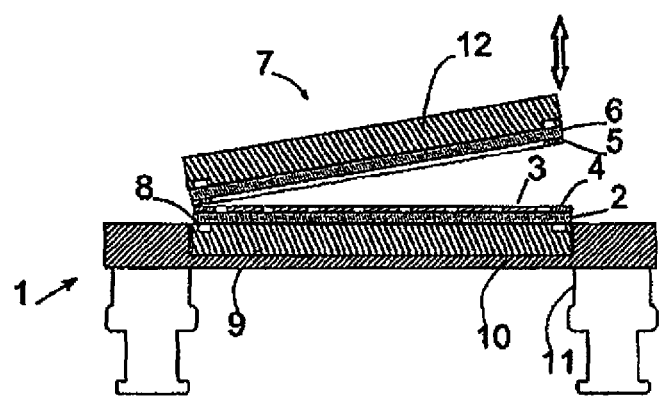
FIG. 3 shows a schematic of the stripping of the product substrate from the carrier substrate according to a first embodiment of the invention.
Figure 4:
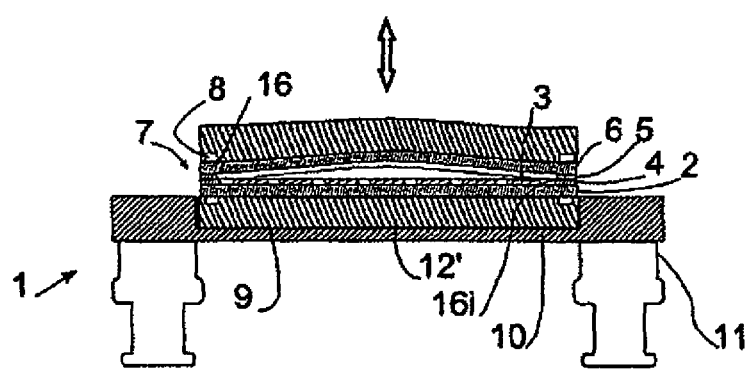
FIG. 4 shows a schematic of the stripping of the product substrate from the carrier substrate according to a second embodiment of the invention.

For the stripping of the product substrate 2 from the carrier substrate 6 after carrying out the corresponding processing steps or transport, two preferred embodiments are shown in FIG. 3 and FIG. 4 which differ with respect to the position of the application of the tensile force for overcoming the adhesion force to the carrier substrate 6.

In the embodiment shown in FIG. 3, the stripping of the product substrate 2 from the carrier substrate 6 takes place by applying to the carrier substrate 6 at least largely on one peripheral section of the lateral periphery 6s a tensile force. The tensile force is transferred to the carrier substrate 6 by a rigid carrier holder 12 on one stripping side 6u facing away from the product substrate receiving site 6o. In this way the carrier substrate 6 is detached from the product substrate 2 which is fixed by a product substrate holder 9 on one holding side 2o which faces away from the interconnect side 2u beginning on the peripheral section of the product substrate 2, by overcoming the adhesion force which is acting between the interconnect layer 5 and antiadhesion layer 4 on the contact surface 16 in this peripheral section. If the tensile force were to be applied not laterally, but rather centrically when using a rigid carrier holder 12, the adhesion force on the entire contact surface 16 would have to be overcome at the same time. This would lead to greater stress on the product substrate 2 by a higher tensile force. The tensile force which is to be applied at the start can be supported by partially breaking the bond between the interconnect layer 5 and antiadhesion layer 4 in the region of the application of the tensile force, therefore from the side, especially by mechanical separating means, for example a blade or a wedge, so that the tensile force can be further reduced.

Both the carrier holder 12 and also the product substrate holder 9 work preferably via suction tracks 8 which fix the product substrate 2 or the carrier substrate 6 as homogeneously as possible, in particular in a blanket manner, on the stripping side 6u of the carrier substrate 6 or the holding side 2o of the product substrate 2.

According to a preferred embodiment of stripping, as illustrated in FIG. 4, a flexible, elastic carrier holder 12' is used to strip the carrier substrate 6 from the product substrate 2, the tensile force during stripping of the carrier substrate 6 being applied largely centrically on the carrier substrate 6 so that the stripping begins, in contrast to the stripping according to FIG. 3, not from the outside, but from one inner side 16i of the contact surface 16.

The stripping thus takes place concentrically from the inside, therefore from the center, to the outside, the bending of the carrier substrate 6 along the product substrate receiving side 6o being adjustable by the elasticity and thickness of the carrier holder 12'.

In the embodiment shown in FIG. 4, it is especially important that the suction tracks 8 on the stripping side 6u of the carrier substrate 6 act as close as possible to the lateral periphery 6s of the carrier substrate 6, especially on the back to the interconnect surface section 13, in order to fix the carrier substrate 6 reliably on the flexible carrier holder 12' during the stripping.

The stripping takes place by a stripping device 1 which is formed by a receiver 10 which is fixed on supports 11 for accommodating the product substrate holder 9 and by the product substrate holder 9 as well as by a vacuum apparatus which is not shown for connection of the suction tracks 8. Furthermore, the stripping device 1 has robotics which applies the described tensile force to the carrier holder 12, 12', in the form of a robot arm (not shown).

The main component for the carrier substrate is advantageously one or more of the following materials as claimed in the invention: Si, glass, ceramic. The main component for the antiadhesion layer/interconnect layer 5 as claimed in the invention is one or more of the following materials: polymers, metals, low-viscosity materials, films.

REFERENCE NUMBER LIST 1 stripping device
2 product substrate
2o holding side
2s lateral periphery
2u interconnect side
3 structures
4 antiadhesion layer
4b ring width
4d thickness
5 interconnect layer
5b ring width
5d thickness
6 carrier substrate
6o product substrate receiving side
6s lateral periphery
6u stripping side
7 product substrate-carrier substrate composite
8 suction structure
9 product substrate holder
10 receiver
11 supports
12, 12' carrier holder
13 interconnect surface section
14 receiving space
15 antiadhesion surface section
16 contact surface
16i inner side
H height Having described the invention, the following is claimed:

1. A method for temporary connection of a product substrate to a carrier substrate comprising the following steps:
   applying an interconnect layer to a product substrate receiving side of the carrier substrate in an interconnect surface section of the product substrate receiving side,
   applying an antiadhesion layer with low adhesion force to one interconnect side of the product substrate in an antiadhesion surface section of the interconnect side, the antiadhesion surface section corresponding to the interconnect surface section in terms of area,
   aligning the product substrate relative to the carrier substrate,
   bonding the interconnect layer to the antiadhesion layer on one contact surface, and
   stripping the carrier substrate from the product substrate,
   wherein a receiving space is formed that is bordered by the interconnect layer and the carrier substrate as well as the product substrate and the antiadhesion layer, the receiving space being configured to accommodate structures provided on the interconnect side of the product substrate and projecting therefrom.

2. The method as claimed in claim 1, wherein the interconnect surface section is located on a lateral periphery of the carrier substrate in a ring section that is concentric to the product substrate receiving side.

3. The method as claimed claim 1 or 2, wherein the antiadhesion surface section is located on a lateral periphery of the product substrate in a ring section that is concentric to the antiadhesion surface section.

4. The method as claimed in claim 1 or 2, wherein the structures are at least partially surrounded by the antiadhesion layer.

5. The method as claimed in claim 1, wherein the step of stripping is performed by applying to the carrier substrate a tensile force that acts at least largely centrically or at least largely laterally on one stripping side of the carrier substrate, the stripping side facing away from the product substrate receiving side.

6. The method as claimed in claim 5, wherein the tensile force is applied by means of a flexible, carrier holder that draws in the stripping side in a blanket manner.

7. The method as claimed in one of claim 5 or 6, wherein the step of stripping takes place concentrically from one inner side of the contact surface, the inner side pointing toward the receiving space.

8. The method as claimed in claim 5, wherein, at a start of the at least largely lateral step of stripping, a partial detachment takes place by mechanical separating means.

* * * * *